(12) United States Patent
Chang et al.

(10) Patent No.: US 11,906,808 B2
(45) Date of Patent: Feb. 20, 2024

(54) OPTICAL MODULE

(71) Applicant: TDK TAIWAN CORP., Taoyuan (TW)

(72) Inventors: Shao-Chung Chang, Taoyuan (TW); Yi-Ho Chen, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 244 days.

(21) Appl. No.: 17/459,302

(22) Filed: Aug. 27, 2021

(65) Prior Publication Data

US 2022/0066230 A1 Mar. 3, 2022

Related U.S. Application Data

(60) Provisional application No. 63/071,550, filed on Aug. 28, 2020.

(51) Int. Cl.
*G02B 27/64* (2006.01)
*G02B 7/04* (2021.01)
(Continued)

(52) U.S. Cl.
CPC ................. *G02B 7/04* (2013.01); *G01L 1/16* (2013.01); *G02B 7/003* (2013.01); *G02B 7/02* (2013.01); *G02B 7/09* (2013.01); *G02B 7/1821* (2013.01); *G02B 13/001* (2013.01); *G02B 26/0816* (2013.01); *G02B 26/0875* (2013.01); *G02B 27/0006* (2013.01); *G02B 27/646* (2013.01); *G03B 5/00* (2013.01); *G03B 17/12* (2013.01); *G06F 3/016* (2013.01); *H02K 41/0354* (2013.01); *H03K 17/964* (2013.01); *H04N 23/55* (2023.01); *H04N 23/685* (2023.01);
(Continued)

(58) Field of Classification Search
CPC . G02B 7/04; G02B 7/003; G02B 7/02; G02B 7/09; G02B 7/1821; G02B 13/001; G02B 26/0816; G02B 26/0875; G02B 27/0006; G02B 27/646; G02B 7/021; G01L 1/16; G03B 5/00; G03B 5/02; G03B 17/12; G03B 2205/0069; G03B 3/10; G03B 30/00; G03B 13/36; G06F 3/016; H02K 41/0354; H02K 41/0356; H03K 17/964; H03K 2217/96062; H03K 17/9517; H04N 23/54; H04N 23/55; H04N 23/685; H10N 30/302; H10N 50/10; H01L 24/50; H05K 1/0277; H05K 1/0278; H05K 1/028; H05K 1/0281; H05K 1/0283; H05K 1/0393; H05K 1/118; H05K 1/147; H05K 1/148; H05K 1/189; H05K 2201/042; H05K 2201/046; H05K 2201/05
USPC .......................................... 174/254; 361/776
See application file for complete search history.

(56) References Cited

U.S. PATENT DOCUMENTS

2019/0018258 A1* 1/2019 Minamisawa ....... H04N 23/687
2019/0132954 A1* 5/2019 Kim ..................... H05K 1/0254
(Continued)

*Primary Examiner* — Darryl J Collins
*Assistant Examiner* — Matthew Y Lee
(74) *Attorney, Agent, or Firm* — Muncy, Geissler, Olds & Lowe, P.C.

(57) ABSTRACT

An optical module is provided, including a movable portion, a fixed portion, and a circuit assembly. The movable portion is configured to connect an optical member, and is movable relative to the fixed portion. Moreover, the movable portion is movably connected to the fixed portion via the circuit assembly.

16 Claims, 13 Drawing Sheets

(51) Int. Cl.
*G02B 7/02* (2021.01)
*G02B 13/00* (2006.01)
*G02B 26/08* (2006.01)
*G02B 7/00* (2021.01)
*G01L 1/16* (2006.01)
*G06F 3/01* (2006.01)
*H03K 17/96* (2006.01)
*G03B 5/00* (2021.01)
*G03B 17/12* (2021.01)
*H02K 41/035* (2006.01)
*G02B 7/09* (2021.01)
*G02B 27/00* (2006.01)
*H04N 23/55* (2023.01)
*H04N 23/68* (2023.01)
*H10N 30/30* (2023.01)
*G02B 7/182* (2021.01)

(52) U.S. Cl.
CPC ... *H10N 30/302* (2023.02); *G03B 2205/0069* (2013.01); *H02K 41/0356* (2013.01); *H03K 2217/96062* (2013.01)

(56) References Cited

U.S. PATENT DOCUMENTS

| | | | |
|---|---|---|---|
| 2020/0257131 A1* | 8/2020 | Arai | G03B 5/06 |
| 2021/0041716 A1* | 2/2021 | Takei | G03B 17/02 |
| 2021/0199912 A1* | 7/2021 | Hu | G02B 7/021 |
| 2021/0251081 A1* | 8/2021 | Kimura | H05K 1/0281 |
| 2021/0251082 A1* | 8/2021 | Ono | G03B 5/06 |
| 2022/0019087 A1* | 1/2022 | Minamisawa | G03B 5/06 |
| 2022/0091476 A1* | 3/2022 | Minamisawa | H04N 23/51 |

* cited by examiner

OPTICAL MODULE

CROSS REFERENCE TO RELATED APPLICATIONS

This application claims the benefit of U.S. Provisional Application No. 63/071,550, filed Aug. 28, 2020, the entirety of which are incorporated by reference herein.

BACKGROUND OF THE INVENTION

Field of the Invention

The application relates in general to an optical module, and in particular, to an optical module having a circuit assembly.

Description of the Related Art

Advanced technology has allowed recent electronic devices (such as tablet computers and smartphones) to include a lens module capable of aiding in photography or recording video. These electronic devices have become more commonplace, and have been developed to be more convenient and thin. More and more choices are provided for users to choose from.

However, an image may come out blurry if the user shakes the lens module in the electronic device. To improve image quality, it is increasingly important to design a shockproof zoom lens module.

BRIEF SUMMARY OF INVENTION

An optical module is provided, including a movable portion, a fixed portion, and a circuit assembly. The movable portion is configured to connect an optical member, and is movable relative to the fixed portion. Moreover, the movable portion is movably connected to the fixed portion via the circuit assembly.

In some embodiments, the circuit assembly has a plate structure.

In some embodiments, the circuit assembly comprises a fixed portion fixing end, a movable portion fixing end, and a first section. The fixed portion fixing end is fixedly connected to the fixed portion. The movable portion fixing end is fixedly connected to the movable portion. The movable portion fixing end is movably connected to the fixed portion fixing end via the first section, wherein the fixed portion fixing end has a plate structure, the first section has a plate structure, and the fixed portion fixing end is parallel to the first section.

In some embodiments, the circuit assembly further comprises a second section, a third section, and a fourth section. The movable portion fixing end is movably connected to the fixed portion fixing end via the second section, the third section, and the fourth section. The first section is movably connected to the movable portion fixing end via the second section. The second section has a plate structure, and the second section is not parallel to the first section. The third section has a plate structure, and the third section is not parallel to the first section. The fourth section has a plate structure, and the fourth section is parallel to the first section. The fourth section is not parallel to the second section. The fourth section is not parallel to the third section. The fourth section is parallel to the fixed portion fixing end. The movable portion fixing end has a plate structure, and the fourth section is parallel to the movable portion fixing end.

In some embodiments, the circuit assembly further comprises a fifth section, and the movable portion fixing end is movably connected to the fixed portion fixing end via the fifth section. The fifth section has a plate structure, and the fifth section is parallel to the first section. The fifth section and the first section are coplanar. The fifth section is not in contact with the first section. The circuit on the fifth section is electrically independent of the circuit on the first section.

In some embodiments, the circuit assembly further comprises a sixth section, and the movable portion fixing end is movably connected to the fixed portion fixing end via the sixth section. The sixth section has a plate structure, and the sixth section is parallel to the first section. The sixth section and the first section are coplanar. The sixth section is not in contact with the first section. The circuit on the sixth section is electrically independent of the circuit on the first section. The fifth section is disposed between the first section and the sixth section.

In some embodiments, the width of the fifth section is substantially the same as the width of the first section and the width of the sixth section. In some embodiments, the width of the fifth section is less than the width of the first section and the width of the sixth section. In some embodiments, the width of the fifth section is greater than the width of the first section and the width of the sixth section.

In some embodiments, the optical module further comprises an electronic member, the second section, the third section, and the fourth section surround a space, and the electronic member is disposed in the space.

In some embodiments, the optical module further comprises a glue, the angle between the upper surface of the first section and the upper surface of the second section is less than the angle between the lower surface of the first section and the lower surface of the second section, and the glue is disposed between the first section and the second section and attached to the upper surface of the first section and the upper surface of the second section.

In some embodiments, the optical module further comprises a glue, the angle between the upper surface of the second section and the upper surface of the fourth section is greater than the angle between the lower surface of the second section and the lower surface of the fourth section, and the glue is disposed between the second section and the fourth section and attached to the lower surface of the second section and the lower surface of the fourth section.

In some embodiments, the optical module further comprises a glue, the angle between the upper surface of the third section and the upper surface of the fourth section is greater than the angle between the lower surface of the third section and the lower surface of the fourth section, and the glue is disposed between the third section and the fourth section and attached to the lower surface of the third section and the lower surface of the fourth section.

In some embodiments, the optical module further comprises a glue, the angle between the upper surface of the third section and the upper surface of the movable portion fixing end is less than the angle between the lower surface of the third section and the lower surface of the movable portion fixing end, and the glue is disposed between the third section and the movable portion fixing end and attached to the upper surface of the third section and the upper surface of the movable portion fixing end.

In some embodiments, the first section has a first main body region and a first connecting region, the first connecting region is disposed between the first main body region and the second section, and the thickness of the first main body region is greater than the thickness of the first connecting region. The second section has a second main body region and two second connecting regions, the second main body region is disposed between the second connecting regions, and the thickness of the second main body region is greater than the thickness of each of the second connecting regions. The third section has a third main body region and a third connecting region, the third connecting region is disposed between the third main body region and the fourth section, and the thickness of the third main body region is greater than the thickness of the third connecting region. The fourth section has a fourth main body region and two fourth connecting regions, the fourth main body region is disposed between the fourth connecting regions, and the thickness of the fourth main body region is greater than the thickness of each of the fourth connecting regions.

In some embodiments, as seen from the normal direction of the fixed portion fixing end, both the first section and the fifth section have a spiral structure. In some embodiments, as seen from the normal direction of the fixed portion fixing end, the first section has a spiral structure.

In some embodiments, the first section comprises a plurality of longitudinal members and a plurality of C-shaped members, and the longitudinal members and the C-shaped members are arranged in a staggered arrangement.

In some embodiments, the movable portion fixing end has a plate structure, and the fixed portion fixing end and the movable portion fixing end are not coplanar.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the optical module are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
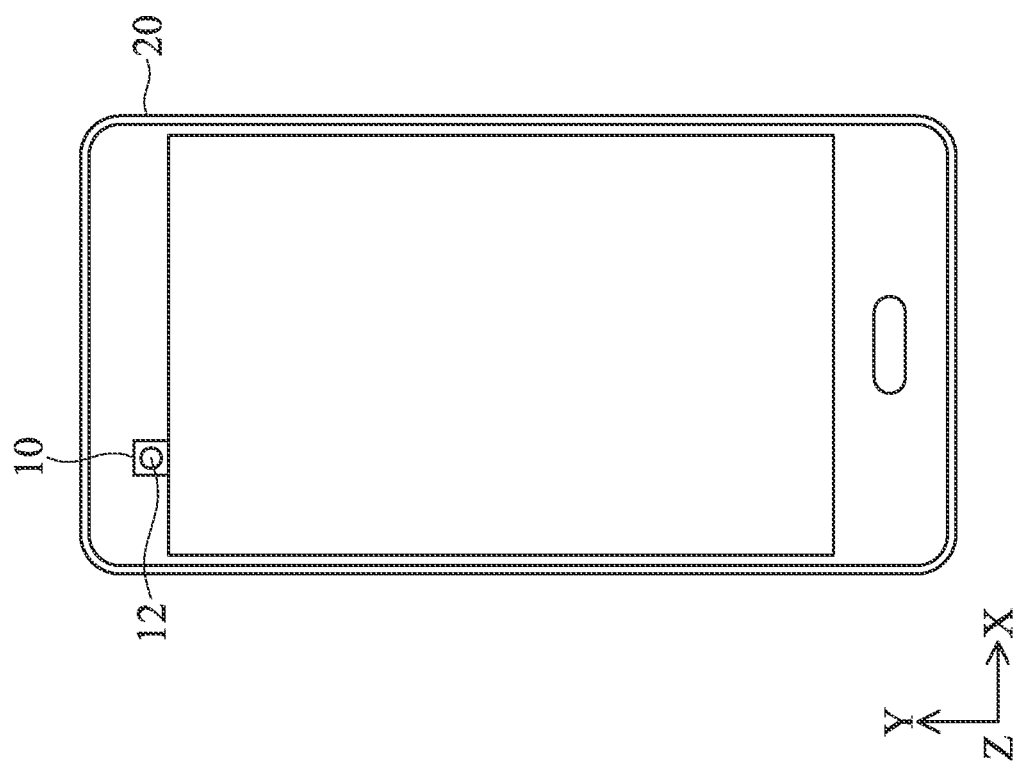
FIG. 1 is a schematic diagram of an electronic device according to an embodiment of the invention.
Figure 2:
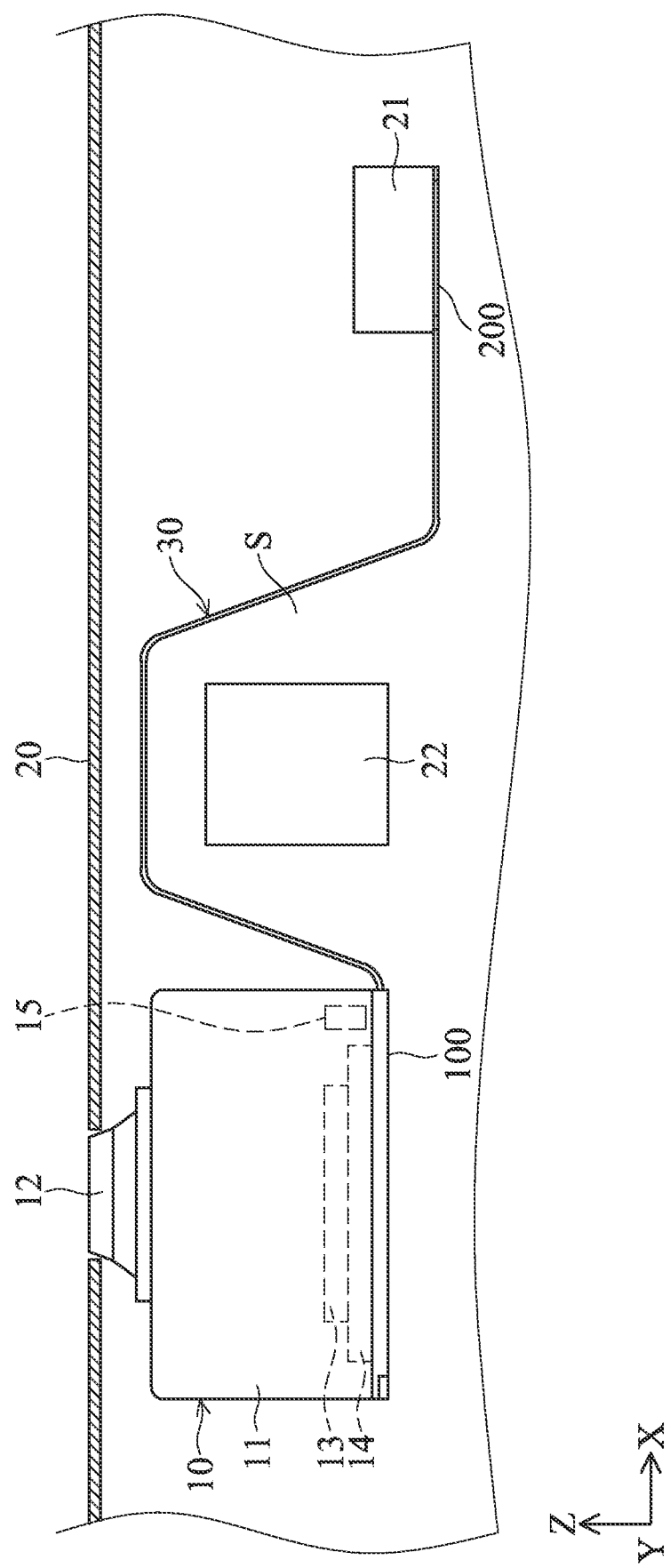
FIG. 2 is a schematic diagram of an optical device and a circuit assembly according to an embodiment of the invention.

Referring to FIG. 1 and FIG. 2, in an embodiment of the invention, an optical device 10 can be disposed in an electronic device 20 and used to take photographs or record video. For example, the electronic device 20 can be a smartphone, a laptop computer, or a digital camera, but it is not limited thereto. The optical device 10 includes a housing 11, a camera lens 12, an optical member 13, a movable portion 14, and an optical member driving mechanism 15. The housing 11 is affixed to the electronic device 20, and the camera lens 12, the optical member 13, the movable portion, and the optical member driving mechanism 15 are accommodated in an accommodating space of the housing 11.

The optical member 13 can be an image sensor. The external light can pass through the camera lens 12 and then reach the optical member 13 to form an image on the optical member 13. The optical member 13 is disposed on the movable portion 14. The optical member driving mechanism 15 can drive the movable portion 14 to rotate and/or shift, so as to drive the optical member 13 to rotate and/or shift simultaneously. The purpose of optical image stabilization can be therefore achieved.

The optical member driving mechanism 15 can use different driving methods as required. For example, the optical member driving mechanism 15 can include at least one magnet and at least one coil, and drive the movable portion 14 by the magnetic pushing force between the magnet and the coil. In some embodiments, the optical member driving mechanism 15 can include a shape memory alloy, and drive the movable portion 14 by the deformation of the shape memory alloy.

The optical member 13 is connected to an electronic member 21 in the electronic device 20 via a circuit assembly 30. For example, the electronic member 21 can be a central processing unit (CPU), a graphics processing unit (GPU), a chipset, a hard disk, or a memory (such as a read only memory (ROM), a flash memory, or a random access memory (RAM)). In this embodiment, the electronic member 21 in the electronic device 20 that is connected to the circuit assembly 30 is affixed to the electronic device 20. Thus, when the optical member driving mechanism 15 drives the movable portion 14 to move, the movable portion 14 and the optical member 13 move relative to the electronic member 21. In this embodiment, the electronic member 21 in the electronic device 20 can be defined as a fixed portion, and the movable portion 14 the fixed portion, and the circuit assembly 30 can form an optical module.

Figure 3:
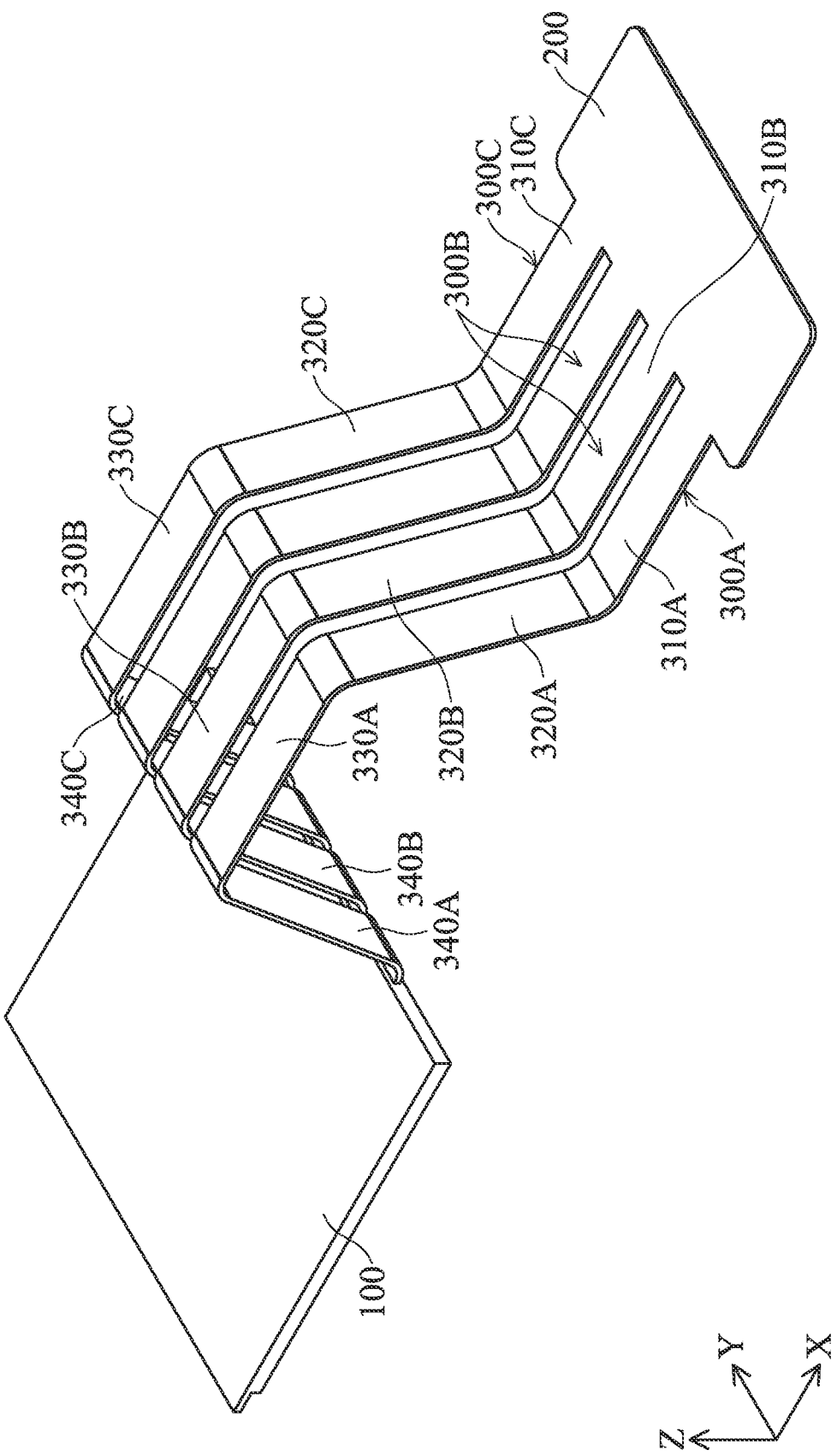
FIG. 3 is a schematic diagram of the circuit assembly according to an embodiment of the invention.
Figure 4:
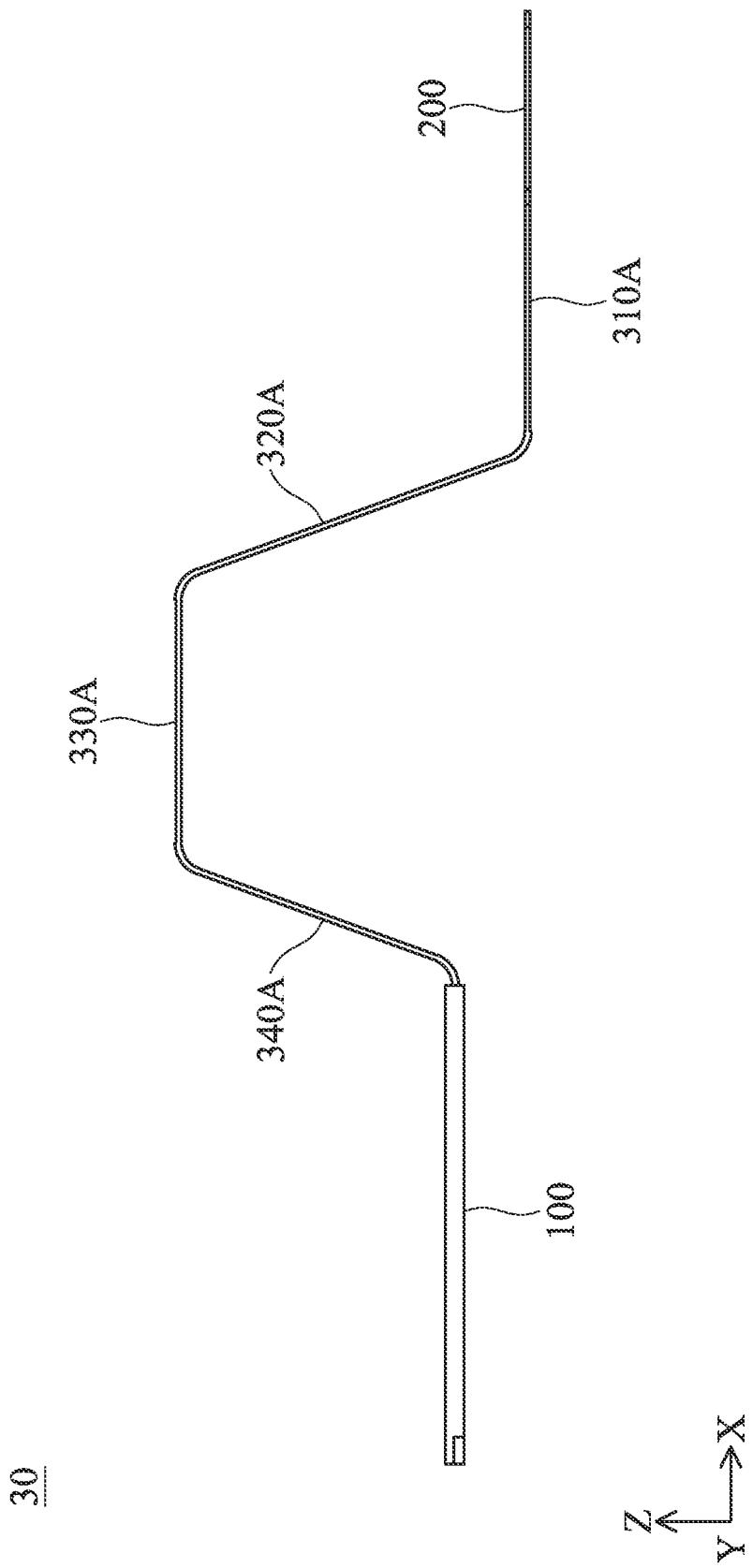
FIG. 4 is a front view of the circuit assembly according to an embodiment of the invention.
Figure 5:
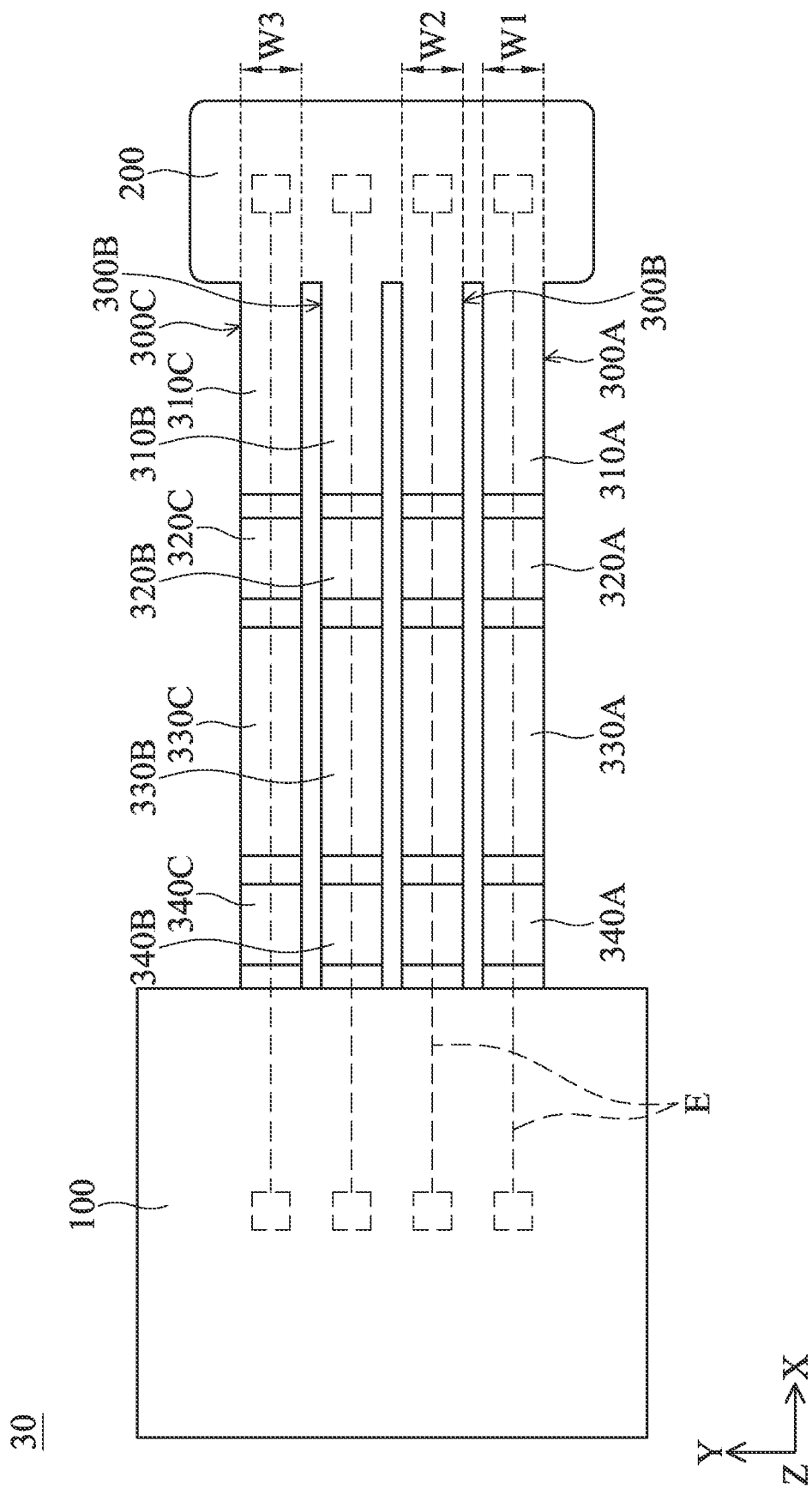
FIG. 5 is a top view of the circuit assembly according to an embodiment of the invention.

FIG. 3 is a schematic diagram of the circuit assembly 30, FIG. 4 is a front view of the circuit assembly 30, and FIG. 5 is a top view of the circuit assembly 30. As shown in FIG. 2 to FIG. 5, the circuit assembly 30 is a bent plate, primarily including a movable portion fixing end 100, a fixed portion fixing end 200, and a plurality of circuit units 300A, 300B, and 300C. The movable portion 14 and the electronic member 21 can be respectively affixed to the movable portion fixing end 100 and the fixed portion fixing end 200. The circuit units 300A, 300B, and 300C are disposed between the movable portion fixing end 100 and the fixed portion fixing end 200, and connect the movable portion fixing end 100 to the fixed portion fixing end 200. In this embodiment, both the movable portion fixing end 100 and the fixed portion fixing end 200 include a plate structure. The movable portion fixing end 100 and the fixed portion fixing end 200 are parallel, and are not coplanar.

The circuit units 300B are disposed between the circuit unit 300A and the circuit unit 300C, and the circuit units 300A, 300B, and 300C are parallel to each other. Each of the circuit units 300A, 300B, and 300C substantially include the same structure. The following takes the circuit unit 300A as an example for description. In particular, the circuit unit 300A can be divided into a section 310A (a first section), a section 320A (a second section), a section 330A (a fourth section), and a section 340A (a third section) from the fixed portion fixing end 200 to the movable portion fixing end 100.

The section 310A is disposed between the fixed portion fixing end 200 and the section 320A, and connects the fixed portion fixing end 200 to the section 320A. The section 310A has a plate structure that is parallel to the fixed portion fixing end 200. The section 320A is disposed between the section 310A and the section 330A, and connects the section 310A to the section 330A. The section 320A also has a plate structure. The section 320A is inclined relative to the section 310A. In other words, the section 320A is not parallel to the section 310A. In this embodiment, the angle between the section 320A and the section 310A is ranged from 135 degrees to 170 degrees.

The section 330A is disposed between the section 320A and the section 340A, and connects the section 320A to the section 340A. The section 330A has a plate structure that is parallel to the fixed portion fixing end 200. The section 340A is disposed between the section 330A and the movable portion fixing end 100, and connects the section 330A to the movable portion fixing end 100. The section 340A also has a plate structure. The section 340A is inclined relative to the movable portion fixing end 100. In other words, the section 340A is not parallel to the movable portion fixing end 100. In this embodiment, the angle between the section 340A and the movable portion fixing end 100 is ranged from 135 degrees to 170 degrees, and the section 340A is not parallel to the section 320A.

The circuit unit 300B can be divided into a section 310B (a fifth section), a section 320B, a section 330B, an a section 340B, and the structures and the arrangements of the sections 310B, 320B, 330B, 340B are substantially the same as that of the sections 310A, 320A, 330A, 340A of the circuit unit 300A. Similarly, The circuit unit 300C can be divided into a section 310C (a sixth section), a section 320C, a section 330C, an a section 340C, and the structures and the arrangements of the sections 310C, 320C, 330C, 340C are substantially the same as that of the sections 310A, 320A, 330A, 340A of the circuit unit 300A. Therefore, the sections 310A, 310B and 310C are coplanar, the sections 320A, 320B and 320C are coplanar, the sections 330A, 330B and 330C are coplanar, and the sections 340A, 340B and 340C are coplanar.

The aforementioned structures of the circuit assembly 30 make it easier to drive the movable portion 14 to move due to the elastic force of the circuit assembly 30. Furthermore, as shown in FIG. 2, the sections 320A, 330A, and 340A surround a space S, and another electronic member 22 of the electronic device 20 can be disposed in this space S1. Thus, the inner space of the electronic device 20 can be used more efficiently, so as to miniaturize the electronic device 20.

Referring to FIG. 5, in this embodiment, each of the circuit units 300A, 300B, and 300C has a uniform width, and the width W2 of each of the circuit units 300B is the same as the width W1 of the circuit unit 300A and the width W3 of the circuit unit 300C.

Figure 6A:
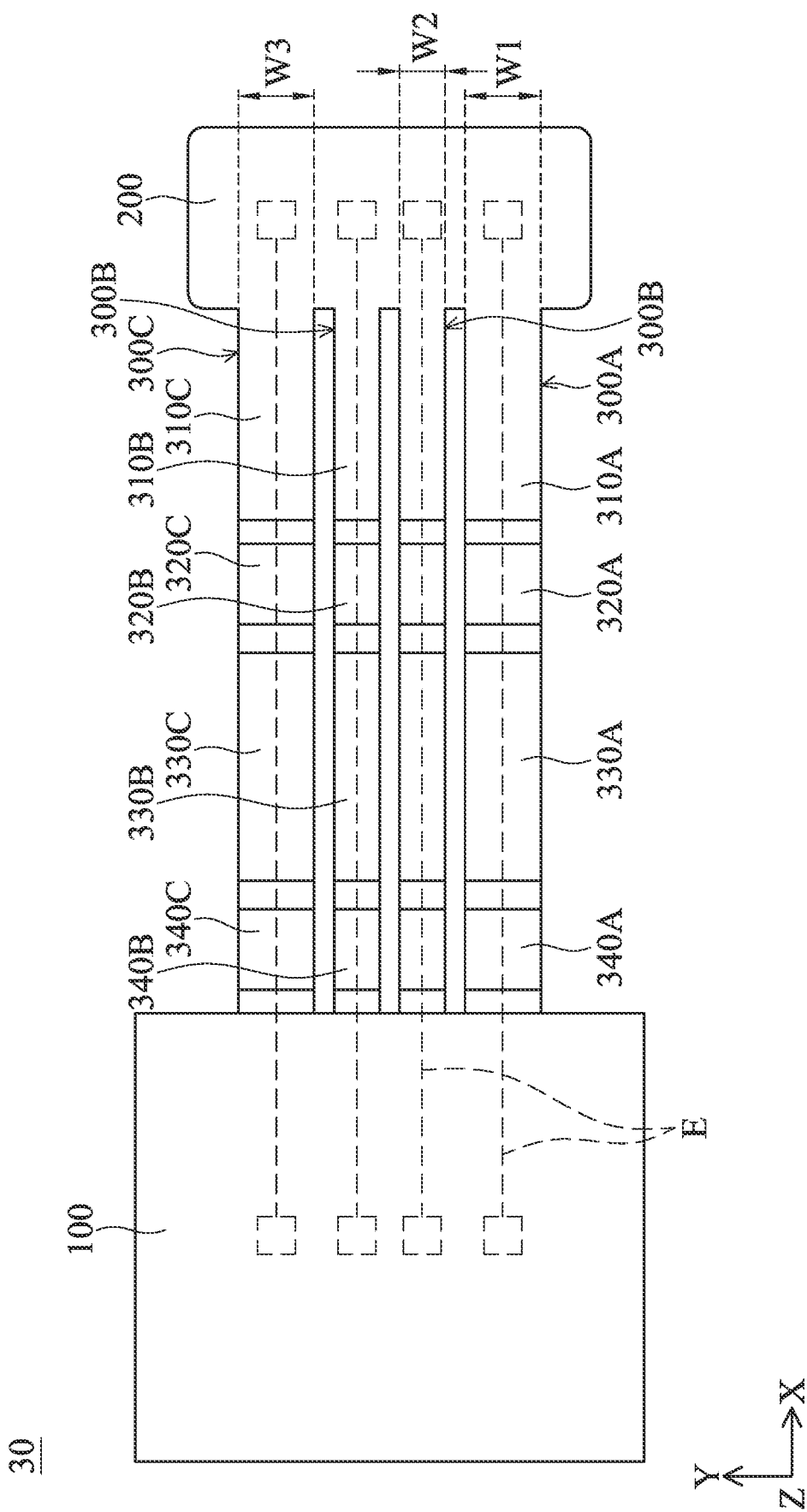
FIG. 6A is a top view of a circuit assembly according to another embodiment of the invention.
Figure 6B:
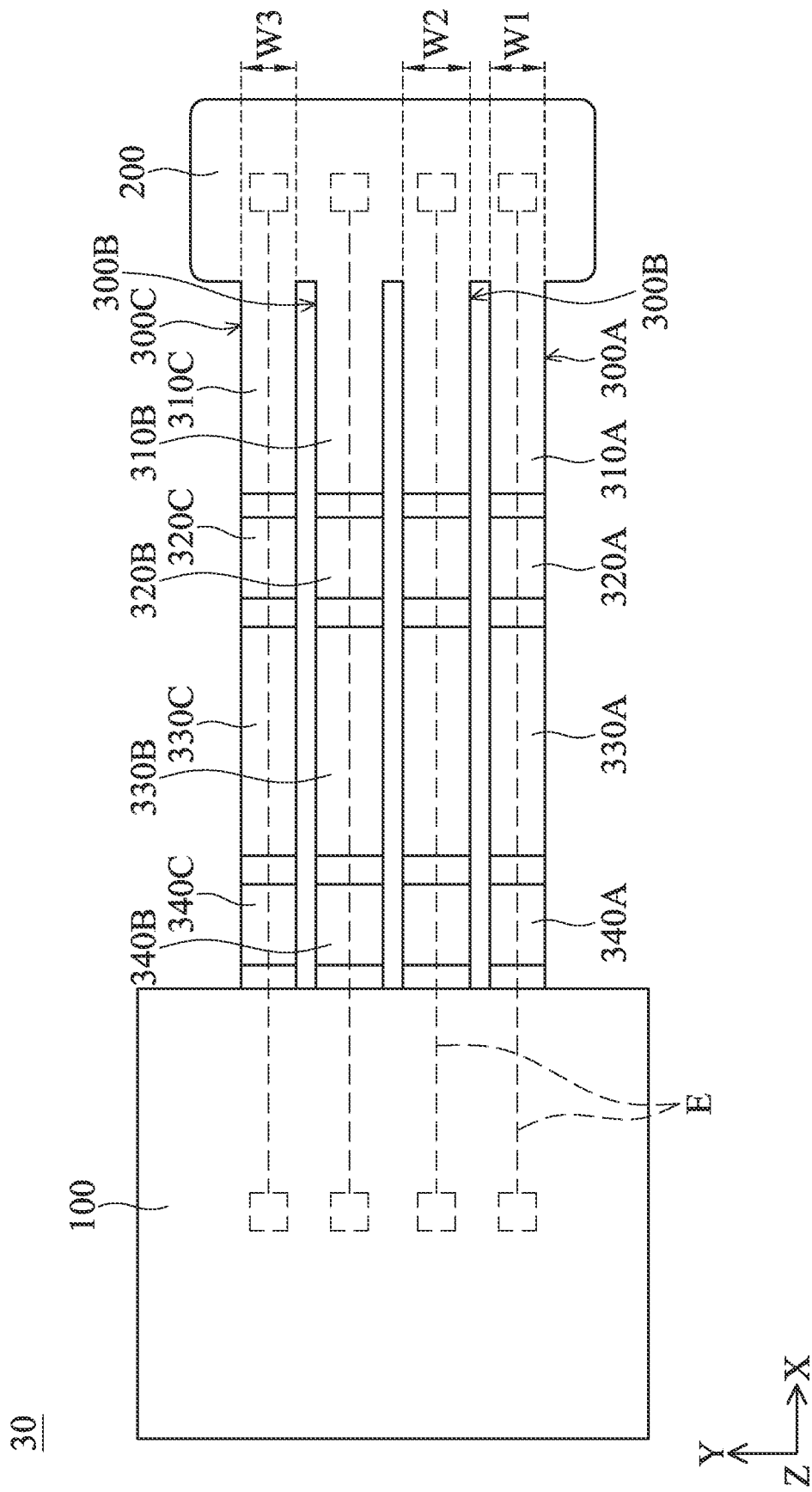
FIG. 6B is a top view of a circuit assembly according to another embodiment of the invention.

Referring to FIG. 6A, in some embodiments, each of the circuit units 300A, 300B, and 300C has a uniform width, and the width W2 of each of the circuit units 300B is less than the width W1 of the circuit unit 300A and the width W3 of the circuit unit 300C. Referring to FIG. 6B, in some embodiments, each of the circuit units 300A. 300B, and 300C has a uniform width, and the width W2 of each of the circuit units 300B is greater than the width W1 of the circuit unit 300A and the width W3 of the circuit unit 300C.

Moreover, it should be noted that, in the aforementioned embodiments, circuits E are disposed on the circuit units 300A, 300B, and 300C, and the circuit E on the circuit units 300A, 300B, and 300C are electrically independent of each other.

Figure 7:
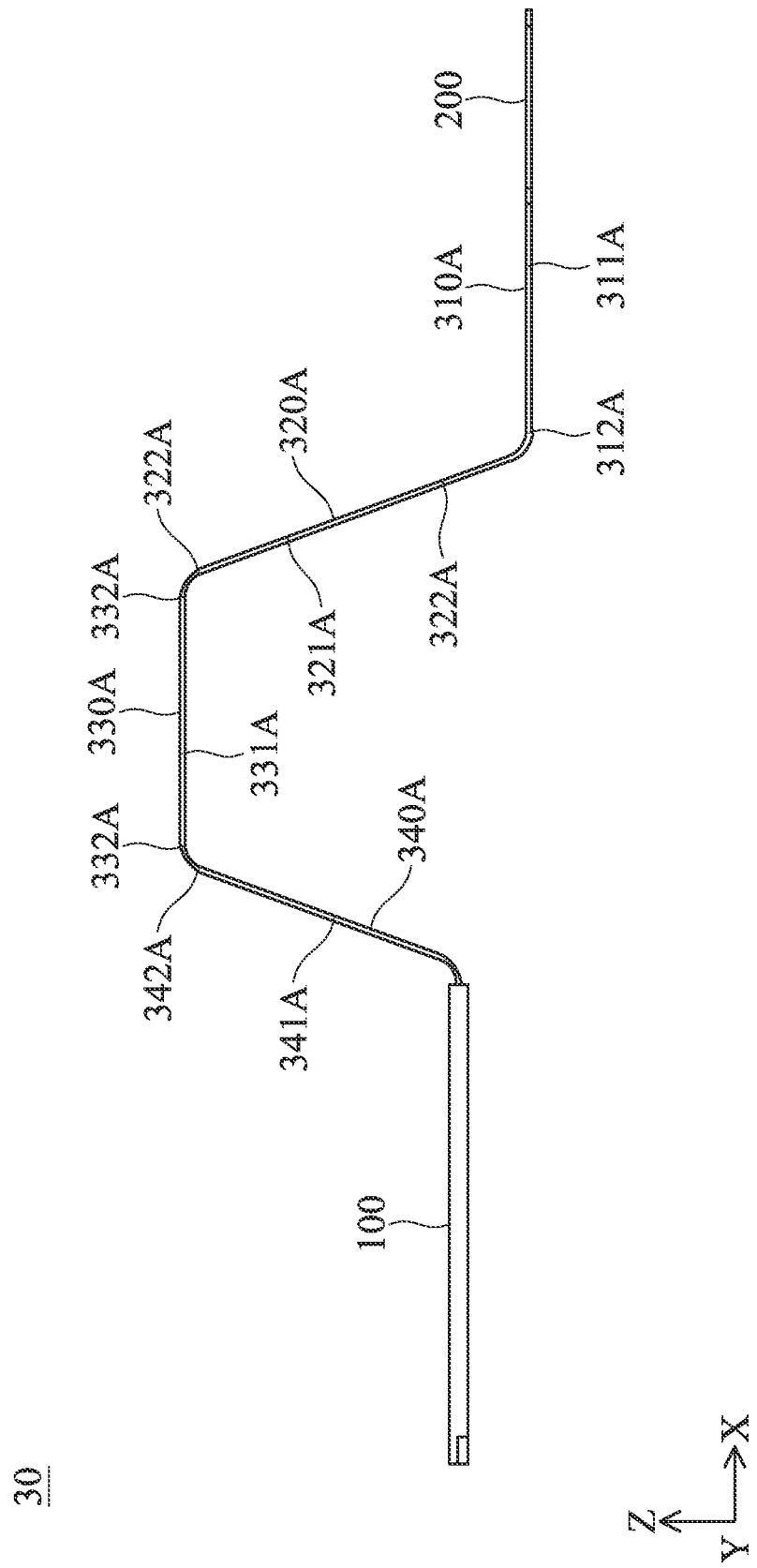
FIG. 7 is a schematic diagram of a circuit assembly according to another embodiment of the invention.

Referring to FIG. 7, in another embodiment of the invention, the section 310A includes a first main body region 311A and a first connecting region 312A. The first connecting region 312A is disposed between the first main body region 311A and the section 320A, and the thickness of the first connecting region 312A is less than the thickness of the first main body region 311A. The section 320A includes a second main body region 321A and two second connecting regions 322A. The second main body region 321A is disposed between two second connecting regions 322A, and is connected to the sections 310A and 330A via the second connecting regions 322A. The thickness of each of the second connecting regions 322A is less than the thickness of the second main body region 321A.

Similarly, the section 330A includes a fourth main body region 331A and two fourth connecting regions 332A. The fourth main body region 331A is disposed between two fourth connecting regions 332A, and is connected to the sections 320A and 340A via the fourth connecting regions 332A. The thickness of each of the fourth connecting regions 332A is less than the thickness of the fourth main body region 331A. The section 340A includes a third main body region 341A and a third connecting region 342A. The third connecting region 342A is disposed between the third main body region 341A and the section 330A, and the thickness of the third connecting region 342A is less than the thickness of the third main body region 341A.

In this embodiment, the structures and the arrangements of the sections 310B, 320B, 330B, and 340B are substantially the same as that of the sections 310A, 320A, 330A, and 340A of the circuit unit 300A, and the structures and the arrangements of the sections 310C, 320C, 330C, and 340C are substantially the same as that of the sections 310A, 320A, 330A, and 340A of the circuit unit 300A, so that the features thereof are not repeated in the interest of brevity.

Owing to the aforementioned structures of the circuit assembly 30 in this embodiment, the thickness of the circuit units is smaller at the connecting portions between the sections (i.e. the bent portions of the circuit assembly 30), making it easier to drive the movable portion 14 to move due to the elastic force of the circuit assembly 30.

Figure 8:
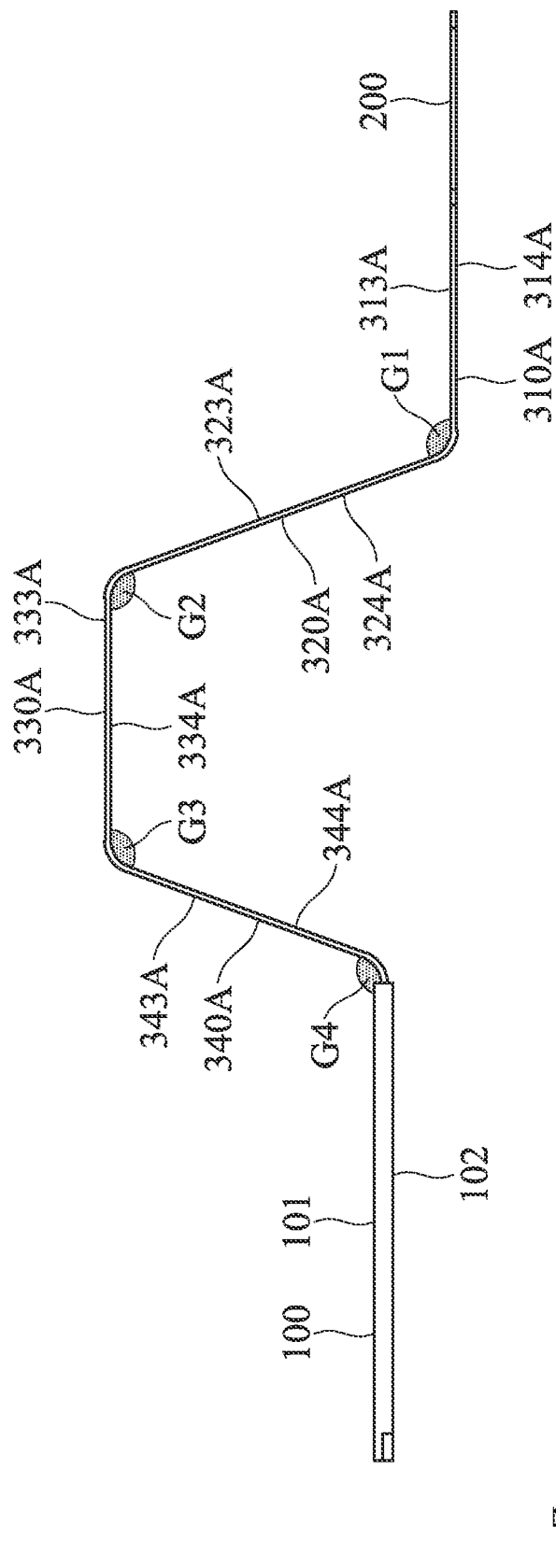
FIG. 8 is a schematic diagram of a circuit assembly according to another embodiment of the invention.

Referring to FIG. 8, in another embodiment of the invention, glues are disposed at the connecting portions between the sections of the circuit units. Take the circuit unit 300A as an example, a glue G1 is disposed at the connecting portion between the section 310A and the section 320A, a glue G2 is disposed at the connecting portion between the section 320A and the section 330A, and a glue G3 is disposed at the connecting portion between the section 330A and the section 340A. In this embodiment, a glue G4 is also disposed between the section 340A and the movable portion fixing end 100.

In detail, the angle the upper surface 313A of the section 310A and the upper surface 323A of the section 320A is less than the angle between the lower surface 314A of the section 310A and the lower surface 324A of the section 320A. The glue G1 is in contact with the upper surface 313A of the section 310A and the upper surface 323A of the section 320A. The angle the upper surface 323A of the section 320A and the upper surface 333A of the section 330A is greater than the angle between the lower surface 324A of the section 320A and the lower surface 334A of the section 330A. The glue G2 is in contact with the lower surface 324A of the section 320A and the lower surface 334A of the section 330A.

The angle the upper surface 333A of the section 330A and the upper surface 343A of the section 340A is greater than the angle between the lower surface 334A of the section 330A and the lower surface 344A of the section 340A. The glue G3 is in contact with the lower surface 334A of the section 330A and the lower surface 344A of the section 340A. The angle the upper surface 343A of the section 340A and the upper surface 101 of the movable portion fixing end 100 is less than the angle between the lower surface 344A of the section 340A and the lower surface 102 of the movable portion fixing end 100. The glue G4 is in contact with the upper surface 343A of the section 340A and the upper surface 101 of the movable portion fixing end 100.

The adhesive force of the glue G1, G2, G3, and G4 can make it easier to drive the movable portion 14 to move due to the elastic force of the circuit assembly 30.

Figure 9A:
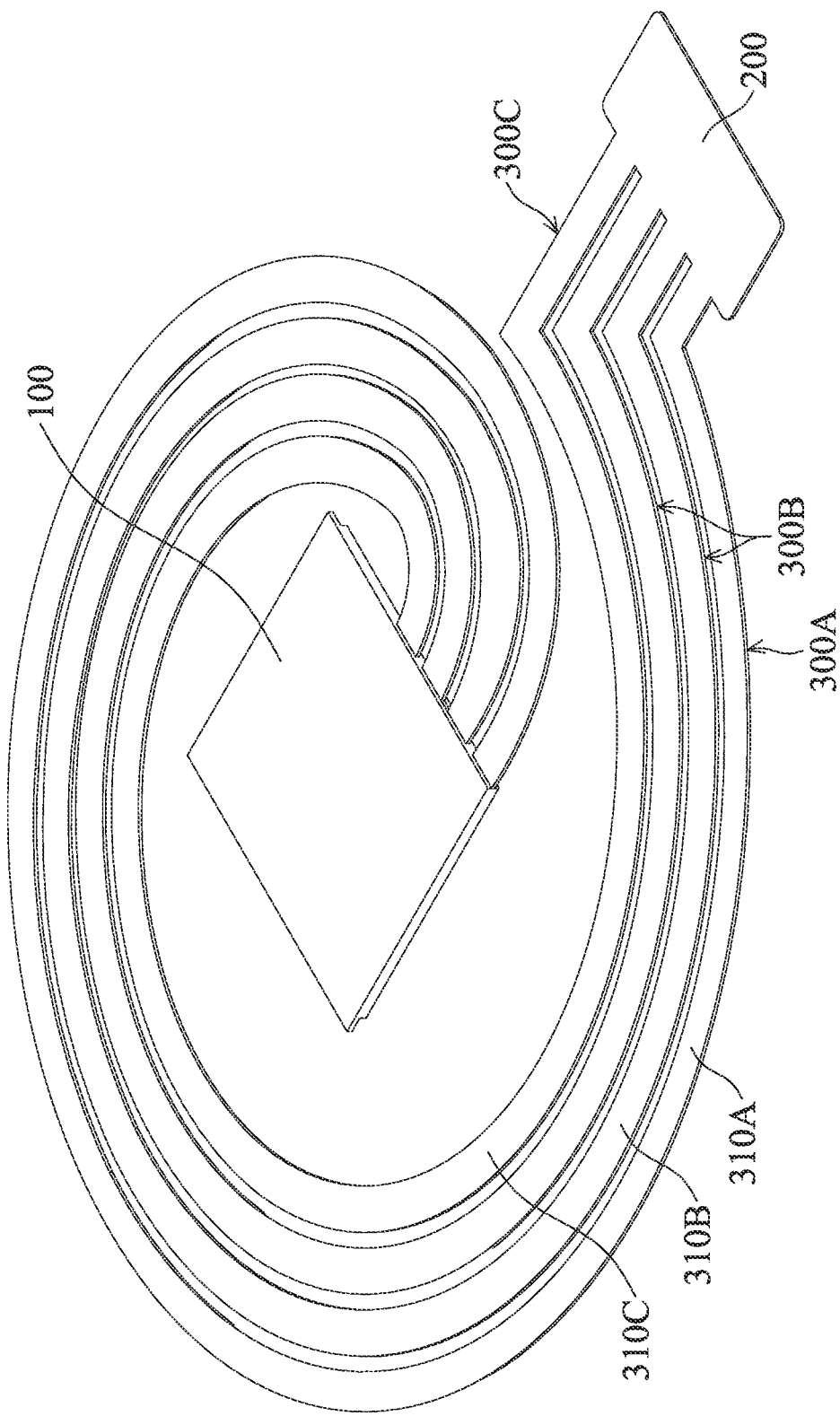
FIG. 9A is a schematic diagram of a circuit assembly according to another embodiment of the invention.
Figure 9B:
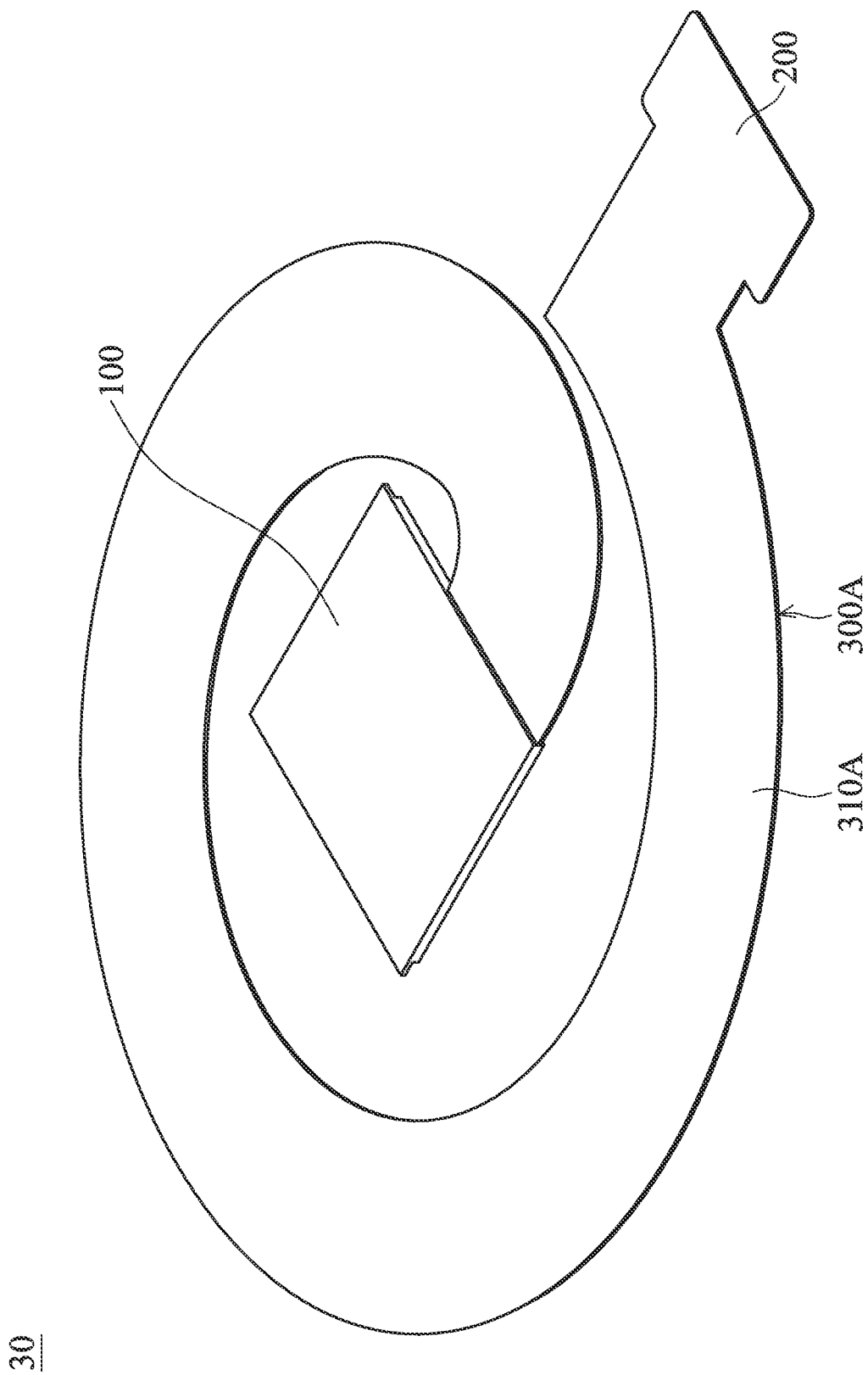
FIG. 9B is a schematic diagram of a circuit assembly according to another embodiment of the invention.

Referring to FIG. 9A, in another embodiment of the invention, the circuit units 300A, 300B, and 300C of the circuit assembly 30 merely includes the sections 310A, 310B, and 310C respectively. As seen from the normal direction of the fixed portion fixing end 200, each of the sections 310A, 310B, 310C has a spiral structure. Referring to FIG. 9B, in another embodiment of the invention, the circuit assembly 30 merely includes one spiral circuit unit 300A, so as to simplify the process.

Figure 10:
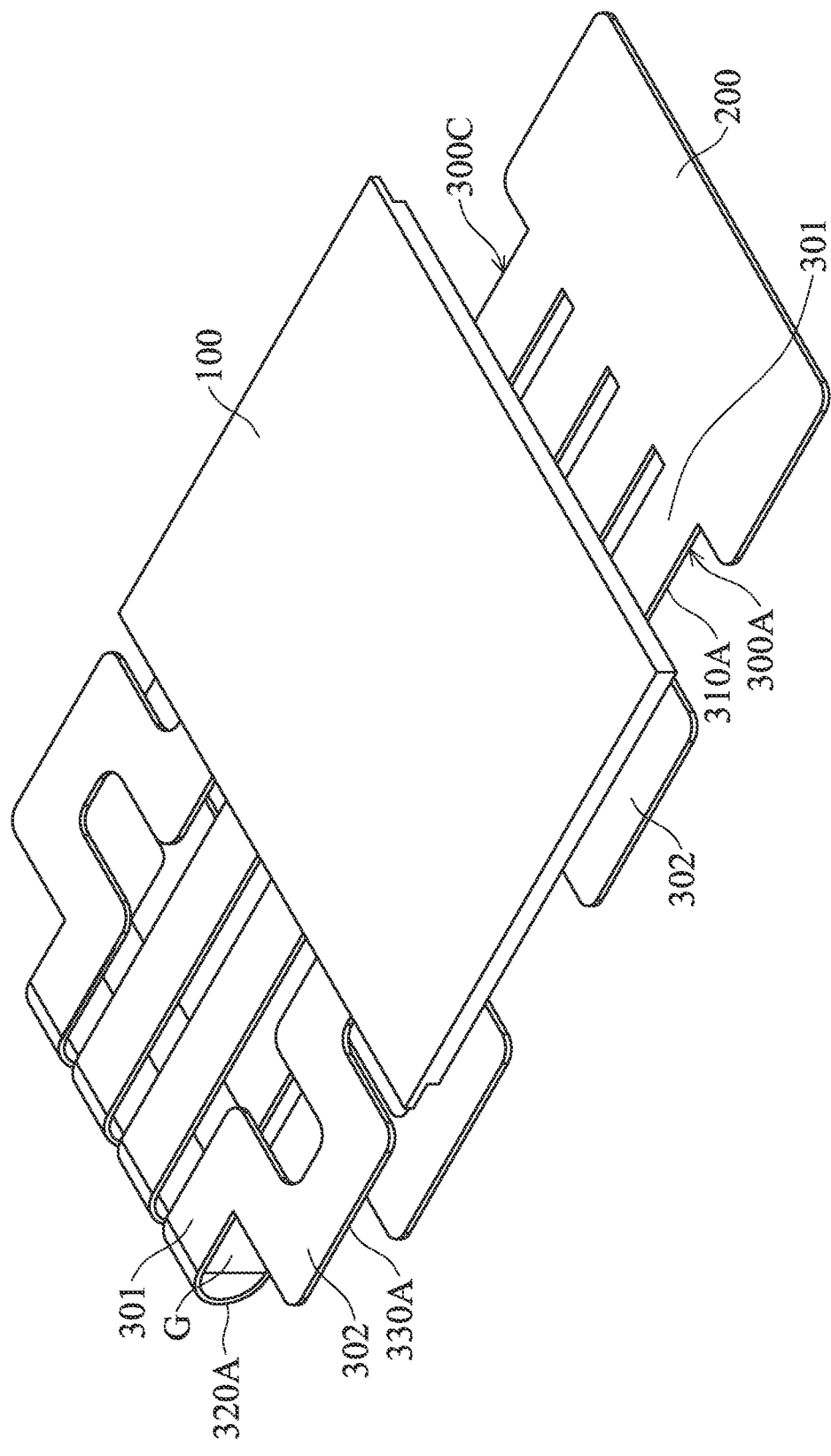
FIG. 10 is a schematic diagram of a circuit assembly according to another embodiment of the invention.

Referring to FIG. 10, in another embodiment of the invention, the circuit units 300A and 300C at the opposite sides can be made by a plurality of longitudinal members 301 and a plurality of C-shaped members 302 arranged in a staggered arrangement, and the section 340A of the circuit unit 300A, the section 340B of the circuit unit 300B, and the section 340C of the circuit unit 300C are omitted. The sections 310A, 310B, and 310C are attached to the sections 330A, 330B, and 330C via a glue G.

Figure 11:
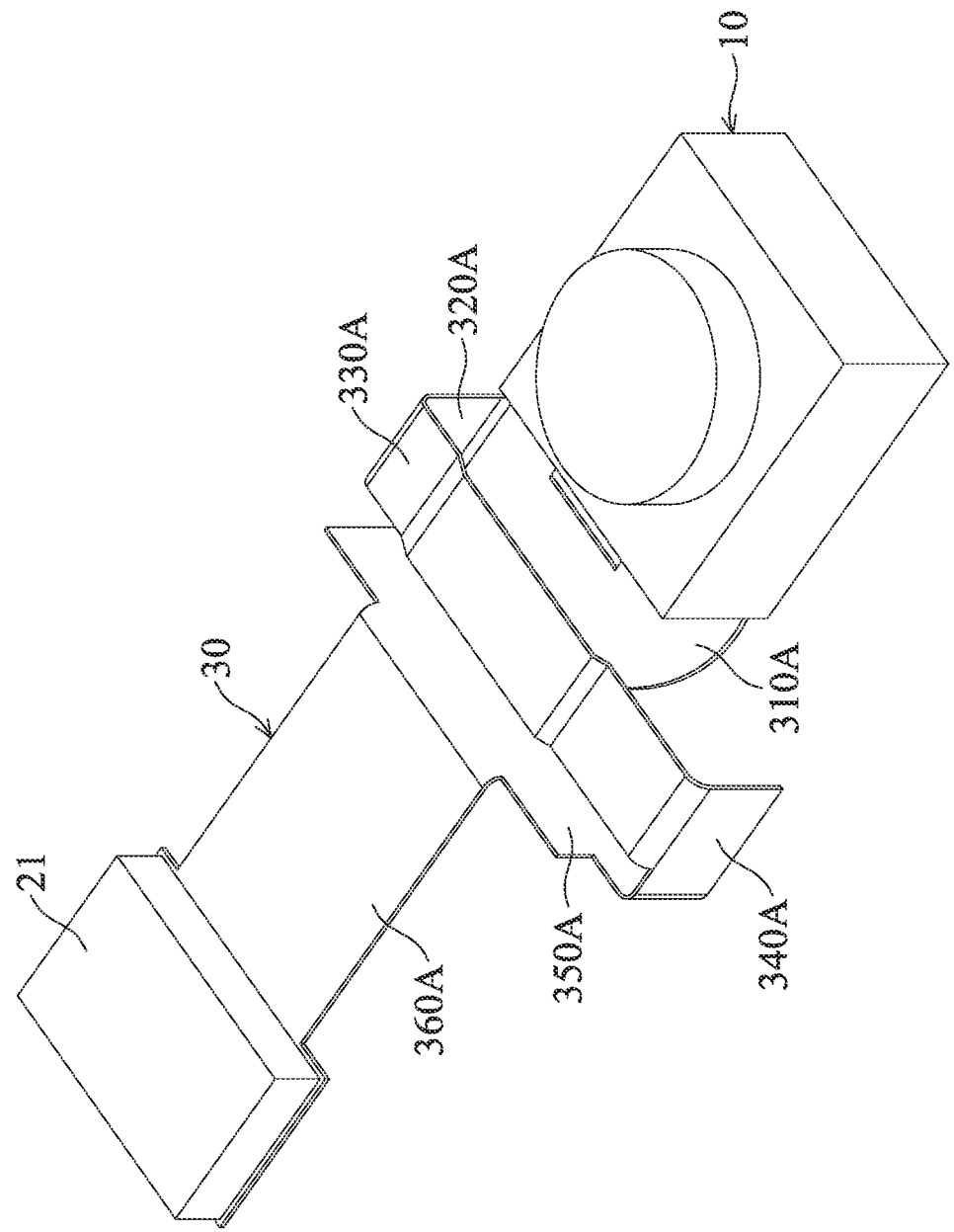
FIG. 11 is a schematic diagram of an optical device, an electronic member, and a circuit assembly according to another embodiment of the invention.

Referring to FIG. 11, in some embodiments, the circuit assembly 30 merely has one circuit unit 300A, and the circuit unit 300A can be bent and form more sections 310A, 320A, 330A, 340A, 350A, and 360A as required.

The features between the aforementioned embodiments can be used or combined as long as they do not violate the spirit or conflict In summary, an optical module is provided, including a movable portion, a fixed portion, and a circuit assembly. The movable portion is configured to connect an optical member, and is movable relative to the fixed portion. Moreover, the movable portion is movably connected to the fixed portion via the circuit assembly.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An optical module, comprising:
   a movable portion, configured to connect an optical member;
   a fixed portion, wherein the movable portion is movable relative to the fixed portion; and
   a circuit assembly, wherein the movable portion is movably connected to the fixed portion via the circuit assembly, wherein the circuit assembly comprises:
   a fixed portion fixing end, fixedly connected to the fixed portion;
   a movable portion fixing end, fixedly connected to the movable portion;
   a first section, wherein the movable portion fixing end is movably connected to the fixed portion fixing end via the first section, the fixed portion fixing end has a plate structure, the first section has a plate structure, and the fixed portion fixing end is parallel to the first section;
   a second section, wherein the movable portion fixing end is movably connected to the fixed portion fixing end via the second section;
   a third section, wherein the movable portion fixing end is movably connected to the fixed portion fixing end via the third section;
   a fourth section, wherein the movable portion fixing end is movably connected to the fixed portion fixing end via the fourth section; and
   a fifth section, wherein the movable portion fixing end is movably connected to the fixed portion fixing end via the fifth section;
   the first section is movably connected to the movable portion fixing end via the second section;

the second section has a plate structure, and the second section is not parallel to the first section;

the third section has a plate structure, and the third section is not parallel to the first section;

the fourth section has a plate structure, and the fourth section is parallel to the first section;

the fourth section is not parallel to the second section;

the fourth section is not parallel to the third section;

the fourth section is parallel to the fixed portion fixing end;

the movable portion fixing end has a plate structure, and the fourth section is parallel to the movable portion fixing end;

the fifth section has a plate structure, and the fifth section is parallel to the first section;

the fifth section and the first section are coplanar;

the fifth section is not in contact with the first section;

the circuit on the fifth section is electrically independent of the circuit on the first section.

2. The optical module as claimed in claim 1, wherein the circuit assembly has a plate structure.

3. The optical module as claimed in claim 1, wherein the circuit assembly further comprises a sixth section, and the movable portion fixing end is movably connected to the fixed portion fixing end via the sixth section;

the sixth section has a plate structure, and the sixth section is parallel to the first section;

the sixth section and the first section are coplanar;

the sixth section is not in contact with the first section;

the circuit on the sixth section is electrically independent of the circuit on the first section;

the fifth section is disposed between the first section and the sixth section.

4. The optical module as claimed in claim 3, wherein the width of the fifth section is substantially the same as the width of the first section and the width of the sixth section.

5. The optical module as claimed in claim 3, wherein the width of the fifth section is less than the width of the first section and the width of the sixth section.

6. The optical module as claimed in claim 3, wherein the width of the fifth section is greater than the width of the first section and the width of the sixth section.

7. The optical module as claimed in claim 1, wherein the optical module further comprises an electronic member, the second section, the third section, and the fourth section surround a space, and the electronic member is disposed in the space.

8. The optical module as claimed in claim 1, wherein the optical module further comprises a glue, an angle between an upper surface of the second section and an upper surface of the fourth section is greater than an angle between a lower surface of the second section and a lower surface of the fourth section, and the glue is disposed between the second section and the fourth section and attached to the lower surface of the second section and the lower surface of the fourth section.

9. The optical module as claimed in claim 1, wherein the optical module further comprises a glue, an angle between an upper surface of the third section and an upper surface of the fourth section is greater than an angle between a lower surface of the third section and a lower surface of the fourth section, and the glue is disposed between the third section and the fourth section and attached to the lower surface of the third section and the lower surface of the fourth section.

10. The optical module as claimed in claim 1, wherein as seen from the normal direction of the fixed portion fixing end, both the first section and the fifth section have a spiral structure.

11. The optical module as claimed in claim 1, wherein as seen from the normal direction of the fixed portion fixing end, the first section has a spiral structure.

12. The optical module as claimed in claim 1, wherein the first section comprises a plurality of longitudinal members and a plurality of C-shaped members, and the longitudinal members and the C-shaped members are arranged in a staggered arrangement.

13. The optical module as claimed in claim 1, wherein the movable portion fixing end has a plate structure, and the fixed portion fixing end and the movable portion fixing end are not coplanar.

14. An optical module, comprising:

a movable portion, configured to connect an optical member;

a fixed portion, wherein the movable portion is movable relative to the fixed portion;

a circuit assembly, wherein the movable portion is movably connected to the fixed portion via the circuit assembly, wherein the circuit assembly comprises:

a fixed portion fixing end, fixedly connected to the fixed portion;

a movable portion fixing end, fixedly connected to the movable portion;

a first section, wherein the movable portion fixing end is movably connected to the fixed portion fixing end via the first section, the fixed portion fixing end has a plate structure, the first section has a plate structure, and the fixed portion fixing end is parallel to the first section;

a second section, wherein the movable portion fixing end is movably connected to the fixed portion fixing end via the second section;

a third section, wherein the movable portion fixing end is movably connected to the fixed portion fixing end via the third section; and a fourth section, wherein the movable portion fixing end is movably connected to the fixed portion fixing end via the fourth section; and a glue, an angle between an upper surface of the first section and an upper surface of the second section is less than an angle between a lower surface of the first section and a lower surface of the second section, and the glue is disposed between the first section and the second section and attached to the upper surface of the first section and the upper surface of the second section;

the first section is movably connected to the movable portion fixing end via the second section;

the second section has a plate structure, and the second section is not parallel to the first section;

the third section has a plate structure, and the third section is not parallel to the first section;

the fourth section has a plate structure, and the fourth section is parallel to the first section;

the fourth section is not parallel to the second section;

the fourth section is not parallel to the third section;

the fourth section is parallel to the fixed portion fixing end;

the movable portion fixing end has a plate structure, and the fourth section is parallel to the movable portion fixing end.

15. An optical module, comprising:

a movable portion, configured to connect an optical member;

a fixed portion, wherein the movable portion is movable relative to the fixed portion; and
a circuit assembly, wherein the movable portion is movably connected to the fixed portion via the circuit assembly, wherein the circuit assembly comprises:
a fixed portion fixing end, fixedly connected to the fixed portion;
a movable portion fixing end, fixedly connected to the movable portion;
a first section, wherein the movable portion fixing end is movably connected to the fixed portion fixing end via the first section, the fixed portion fixing end has a plate structure, the first section has a plate structure, and the fixed portion fixing end is parallel to the first section;
a second section, wherein the movable portion fixing end is movably connected to the fixed portion fixing end via the second section;
a third section, wherein the movable portion fixing end is movably connected to the fixed portion fixing end via the third section; and
a fourth section, wherein the movable portion fixing end is movably connected to the fixed portion fixing end via the fourth section; and
a glue, an angle between an upper surface of the third section and an upper surface of the movable portion fixing end is less than an angle between a lower surface of the third section and a lower surface of the movable portion fixing end, and the glue is disposed between the third section and the movable portion fixing end and attached to the upper surface of the third section and the upper surface of the movable portion fixing end;
the first section is movably connected to the movable portion fixing end via the second section;
the second section has a plate structure, and the second section is not parallel to the first section;
the third section has a plate structure, and the third section is not parallel to the first section;
the fourth section has a plate structure, and the fourth section is parallel to the first section;
the fourth section is not parallel to the second section;
the fourth section is not parallel to the third section;
the fourth section is parallel to the fixed portion fixing end;
the movable portion fixing end has a plate structure, and the fourth section is parallel to the movable portion fixing end.

16. An optical module, comprising:
a movable portion, configured to connect an optical member;
a fixed portion, wherein the movable portion is movable relative to the fixed portion; and
a circuit assembly, wherein the movable portion is movably connected to the fixed portion via the circuit assembly, wherein the circuit assembly comprises:
a fixed portion fixing end, fixedly connected to the fixed portion;
a movable portion fixing end, fixedly connected to the movable portion;
a first section, wherein the movable portion fixing end is movably connected to the fixed portion fixing end via the first section, the fixed portion fixing end has a plate structure, the first section has a plate structure, and the fixed portion fixing end is parallel to the first section;
a second section, wherein the movable portion fixing end is movably connected to the fixed portion fixing end via the second section;
a third section, wherein the movable portion fixing end is movably connected to the fixed portion fixing end via the third section; and
a fourth section, wherein the movable portion fixing end is movably connected to the fixed portion fixing end via the fourth section;
the first section is movably connected to the movable portion fixing end via the second section;
the second section has a plate structure, and the second section is not parallel to the first section;
the third section has a plate structure, and the third section is not parallel to the first section;
the fourth section has a plate structure, and the fourth section is parallel to the first section;
the fourth section is not parallel to the second section;
the fourth section is not parallel to the third section;
the fourth section is parallel to the fixed portion fixing end;
the movable portion fixing end has a plate structure, and the fourth section is parallel to the movable portion fixing end;
the first section has a first main body region and a first connecting region, the first connecting region is disposed between the first main body region and the second section, and the thickness of the first main body region is greater than the thickness of the first connecting region;
the second section has a second main body region and two second connecting regions, the second main body region is disposed between the second connecting regions, and the thickness of the second main body region is greater than the thickness of each of the second connecting regions;
the third section has a third main body region and a third connecting region, the third connecting region is disposed between the third main body region and the fourth section, and the thickness of the third main body region is greater than the thickness of the third connecting region;
the fourth section has a fourth main body region and two fourth connecting regions, the fourth main body region is disposed between the fourth connecting regions, and the thickness of the fourth main body region is greater than the thickness of each of the fourth connecting regions.

* * * * *